United States Patent [19]
Park

[11] Patent Number: 5,677,225
[45] Date of Patent: Oct. 14, 1997

[54] PROCESS FOR FORMING A SEMICONDUCTOR MEMORY CELL

[75] Inventor: Gum-Jin Park, Galsan-dong, Rep. of Korea

[73] Assignee: LG Semicon, Co. Ltd., Cheongju, Rep. of Korea

[21] Appl. No.: 420,468

[22] Filed: Apr. 12, 1995

[30] Foreign Application Priority Data

Apr. 12, 1994 [KR] Rep. of Korea .................. 94-7589

[51] Int. Cl.$^6$ ............................................. H01L 21/70
[52] U.S. Cl. ........................... 437/60; 437/47; 437/52; 437/919
[58] Field of Search ....................... 437/47, 52, 60, 437/228, 919; 257/303

[56] References Cited

U.S. PATENT DOCUMENTS 5,126,280  6/1992  Chan et al. ................................. 437/60
5,150,276  9/1992  Gonzalez ................................... 437/52

FOREIGN PATENT DOCUMENTS 108390  5/1984  European Pat. Off. .
0091957  4/1991  Japan ........................................ 437/52
91-7781  2/1991  Rep. of Korea ......................... 27/108

*Primary Examiner*—Tuan H. Nguyen
*Attorney, Agent, or Firm*—Loudermilk & Associates

[57] ABSTRACT

In the present invention, a cylindrical or a cup shaped capacitor electrodes is formed within a trench. The process may include the steps of: (a) forming a trench in a semiconductor substrate, filling a first material layer which contains impurity material into the trench, carrying out a heat treatment to diffuse impurities of the first material layer so as to form an impurity diffusion region in the substrate surrounding the trench, and removing the first material layer; (b) depositing first and second insulating layers to a certain thickness on the semiconductor substrate, and carrying out an anisotropic etching of the first and second insulating layers so as to form side walls within the trench; (c) depositing a first conductive layer and etching back the first conductive layer so as to form a first conductive layer pole within the trench, and removing the side walls of the first and second insulating layers by carrying out an isotropic etching so as to form a plate electrode; (d) forming a capacitor dielectric layer on the plate electrode, and forming a capacitor node electrode by depositing a second conductive layer and patterning the second conductive layer.

20 Claims, 4 Drawing Sheets

PROCESS FOR FORMING A SEMICONDUCTOR MEMORY CELL

FIELD OF THE INVENTION

The present invention relates to capacitors for dynamic random access memory ("DRAM") cells and a process for formation thereof, and more particularly to a semiconductor memory cell and a process for formation thereof in which the density of the DRAM is increased by increasing the surface area of the capacitor.

BACKGROUND OF THE INVENTION

In accordance with the increasing demand for high density and large capacity in semiconductor memory devices, the key to technical progress has been reducing the area of the memory cell while at the same time maximizing memory capacity.

A DRAM memory cell of a semiconductor device typically consists of a MOS transistor and a charge storing capacitor connected to the transistor. In accordance with the trend of reducing the cell area and increasing the capacitance of the capacitor, various capacitor structures have been proposed. Typical capacitor structures are the stacked-type capacitor and the trench-type capacitor. In the latter, a trench is formed in the substrate, and the surface of the trench is utilized as the capacitor area.

A conventional process for formation of a trench-type capacitor is disclosed in Korean Patent Publication No. 91-7781 dated Oct. 2, 1991. This process will be described with reference to FIG. 1.

As illustrated in FIG. 1A, trench 1 is formed in semiconductor substrate 16, and oxide layer 2 is deposited. Oxide layer 2 on the bottom of the trench is etched to open the trench bottom. Polysilicon layer 3 is deposited on oxide layer 2 and on the bottom of trench 1. Through an ion implantation or using $POCl_3$, the polysilicon layer is doped to a concentration on the order of $10^{20}-10^{21}/cm^3$ with the same conduction type impurity as that of the semiconductor substrate.

As illustrated in FIG. 1B, thin oxide layer 4 to be used as a dielectric layer of a storage capacitor is formed on doped polysilicon 3, and polysilicon layer 5 is deposited.

As illustrated in FIG. 1C, an etching is carried out on polysilicon layer 5 and on thin oxide layer 4 down to a certain depth.

As illustrated in FIG. 1D, polysilicon layer 3 is etched to insulate polysilicon layer 3 and polysilicon layer 5 from each other. Oxide layer 6 is formed, and thick oxide layer 7 is deposited.

As illustrated in FIG. 1E, thick oxide layer 7 and oxide layer 6 are subjected to a anisotropic etching so as to remove the oxide layer which is disposed upon polysilicon layer 5 within the trench. Leaving oxide layers 7 and 6 on polysilicon layer 3, polysilicon layer 5' having the same conduction type as that of polysilicon layer 5 is deposited thereon.

As illustrated in FIG. 1F, the surface of the wafer is flattened, and oxide layer 8 is formed for isolating the elements. Oxide layer 9 is formed and doped ($10^{20}-10^{21}/cm^3$) polysilicon layer 3 is heat-treated at a high temperature (800–1100° C.), thereby forming an ohmic-contact between plate node 10 and semiconductor substrate 16.

As illustrated in FIG. 1G, oxide layer 9 is removed, and polysilicon layer 11 is formed for connecting a transistor to a capacitor. Polysilicon layer 11 is doped by using $POCl_3$ or through a high concentration ion implantation.

As illustrated in FIG. 1H, gate electrode 14 is formed, and a high concentration ion implantation (concentration on the order of $10^{13}10^{16}/cm^3$) is carried out to form source region 12 and drain region 13. Polysilicon layer 15 for bit lines is formed after opening a contact hole, thereby fabricating a DRAM cell.

Typically with such a DRAM cell manufactured based on the conventional technique, either a trench type capacitor is formed, or a stacked type capacitor is formed on the semiconductor substrate. Therefore, such a conventional technique has a limit in increasing the capacitance of the cell capacitor and in increasing the density of the memory cells. Further, there exists the problem of worsened topology as the size of the cell becomes smaller.

SUMMARY OF THE INVENTION

The present invention is intended to overcome the above described disadvantages of the conventional technique.

Therefore, it is an object of the present invention to provide a semiconductor memory cell in which the density is increased by forming a capacitor of a large capacitance in a small area.

In the present invention, a cylindrical or a cup shaped capacitor electrode is formed within a trench, so as to form a capacitor having increased capacitance as compared with conventional capacitors.

In achieving the above object, the process for forming a semiconductor memory cell according to the present invention includes the steps of: (a) forming a trench in a semiconductor substrate, filling the trench with a first material layer containing an impurity material, carrying out a heat treatment to diffuse the first impurity material in the first material layer so as to form an impurity diffusion region in the substrate surrounding the trench, and removing the first material layer; (b) depositing first and second insulating layers to a certain thickness on the semiconductor substrate, and carrying out an anisotropic etching of the first and second insulating layers so as to form side walls within the trench; (c) depositing a first conductive layer and etching back the first conductive layer so as to form a first conductive layer pole within the trench, and removing the side walls of the first and second insulating layers by carrying out an isotropic etching so as to form a plate electrode; (d) forming a capacitor dielectric layer on the plate electrode, and forming a capacitor node electrode by depositing a second conductive layer and patterning the second conductive layer; and, (e) forming a pass transistor for connecting the node electrode of the capacitor to a bit line.

The process for forming the pass transistor includes the steps of: depositing third and fourth insulating layers upon the capacitor node electrode, etching the third and fourth insulating layers to define an element isolating portion by a photolithographic process, forming a field oxide layer by applying an oxidizing process, and removing the third and fourth insulating layers; etching back the second conductive layer and the dielectric layer to open the substrate surface in an active region, depositing a third conductive layer, and carrying out a limited etching on the third conductive layer so as to leave only the portion connecting the node electrode to a source region; and forming a gate electrode, a source region and a drain region, with the source region being connected to the node electrode of the storage capacitor.

Another object of the present invention is to provide a semiconductor memory cell comprising: (a) a semiconductor substrate with a trench formed therein; (b) an impurity diffusion region formed in the portion of the semiconductor substrate surrounding the trench; (c) a plate electrode connected from the bottom of the trench to the impurity diffusion region and projecting upward; (d) a capacitor dielectric layer formed on the surface of the capacitor plate electrode; (e) a node electrode isolated from the plate electrode by the dielectric layer and filling the inside of the trench; (f) a pass transistor connected to the node electrode, the pass transistor having a source region, a gate electrode and a drain region. The plate electrode may be shaped like a pole, a cylinder or a cup.

A further object of the present invention is to provide a method for forming a capacitor in a semiconductor substrate, comprising the steps of: (a) forming a trench in the semiconductor substrate, filling the trench with a first material layer containing an impurity material, carrying out a heat treatment so as to diffuse the first impurity material in the first material layer so as to form an impurity diffusion region in the substrate surrounding the trench, and removing the first material layer; (b) depositing first and second insulating layers to a certain thickness on the semiconductor substrate, and carrying out an anisotropic etching of the first and second insulating layers so as to form side walls within the trench; (c) depositing a first conductive layer and etching back the first conductive layer so as to form a first conductive layer pole within the trench, and removing the side walls of the first and second insulating layers by carrying out an isotropic etching so as to form a plate electrode; (d) forming a capacitor dielectric layer on the plate electrode, and forming a capacitor node electrode by depositing a second conductive layer and patterning the second conductive layer.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

FIG. 2 illustrates in sectional views a process for forming a semiconductor memory cell according to the present invention. The preferred embodiments of the present invention will be described in detail with reference to FIG. 2.

Figure 1A:
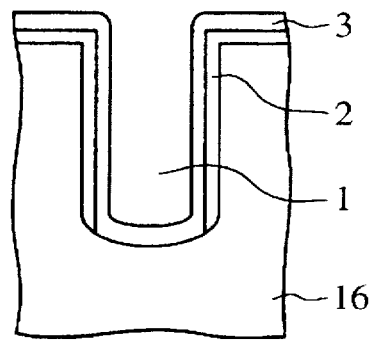
FIGS. 1A to 1H illustrate a conventional process for forming a semiconductor memory cell.
Figure 1B:
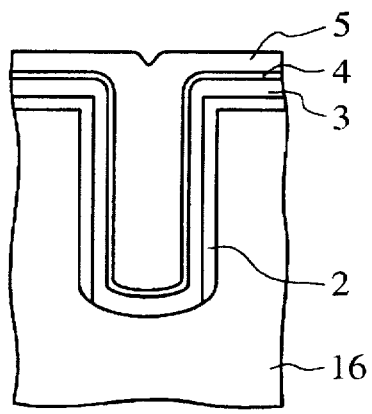
Figure 1C:
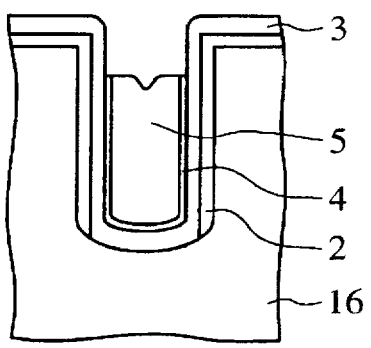
Figure 1D:
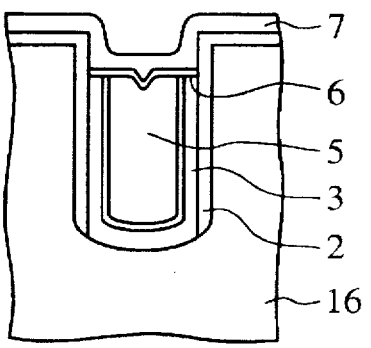
Figure 1E:
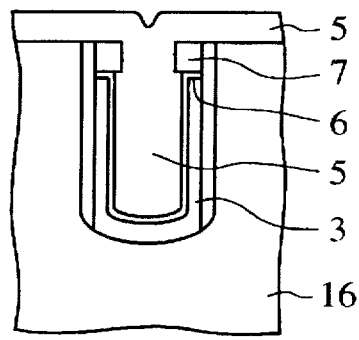
Figure 1F:
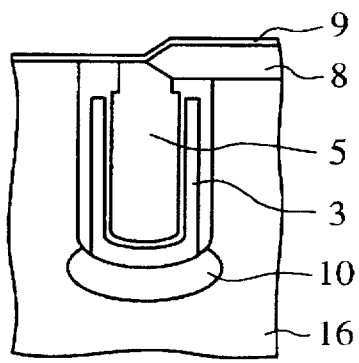
Figure 1G:
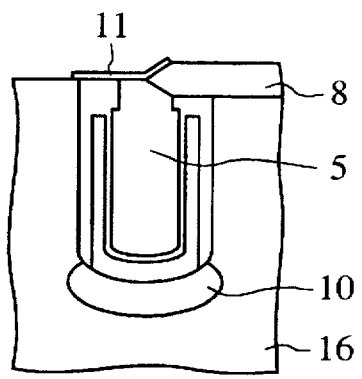
Figure 1H:
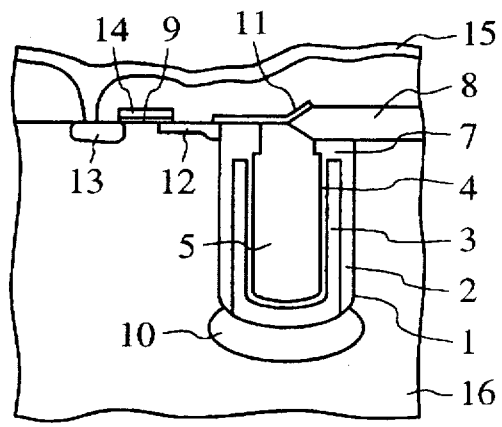
Figure 2A:
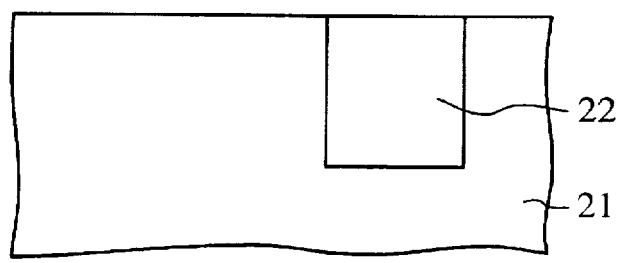
FIGS. 2A to 2F illustrate a process for forming a semiconductor memory cell according to the present invention.

As illustrated in FIG. 2A, semiconductor substrate 21 is etched down to a depth of about 0.5–5 μm, thereby forming a trench. A plug of first material layer 22 containing an impurity is formed within the trench. That is, by using a BSG (borosilicate glass) material, first material layer 22 may be deposited under an atmosphere of $SiH_4+O_2+BH_3$ at a temperature of about 350°–700° C. First material layer 22 is etched back to a certain depth so that the BSG material remains only within the trench.

Figure 2B:
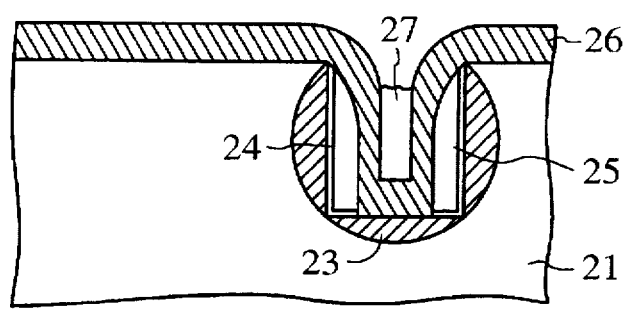

As illustrated in FIG. 2B, a heat treatment is carried out under an $N_2$ gas atmosphere at a temperature of about 600°–900° C. so that the impurity of first material layer 22 may diffuse sideward. Thus, impurity diffusion region 23 is formed in the portion of semiconductor substrate 21 surrounding the trench and first material layer 22.

After formation of impurity diffusion region 23, first material layer 22 is removed, and a cleaning step is carried out.

A thermal oxidation process is carried out under an atmosphere of $H_2+O_2$ or $H_2O$ or $O_2$ at a temperature of about 850°–1000° C. for about 30 minutes to 2 hours, thereby forming first insulating layer 24. Second insulating layer 25 is deposited to a thickness of about 1,000–3,000 Å by applying a CVD method at a temperature of about 350°–700° C. under an atmosphere of $SiH_4+O_2$.

Second insulating layer 25 and second insulating layer 24 are subjected to an anisotropic dry etching, thereby forming side walls within the trench.

After formation of the insulating side walls within the trench, first conductive layer 26, which is a high melting point material such as polysilicon, is deposited to a thickness of about 1,000–2,000 Å under an atmosphere of $SiH_4+PH_3$ at a temperature of about 520°–620° C., thereby forming first conductive layer 26, which is to serve as the plate electrode of a storage capacitor.

In order to etch first conductive layer 26 to a certain height, a second material layer is deposited to be used as a mask, and an etching is carried out so as to leave the second material layer only within first conductive layer 26 of the trench. Thus, mask 27, formed of the second material layer serves to prevent etching of first conductive layer 26.

Figure 2C:
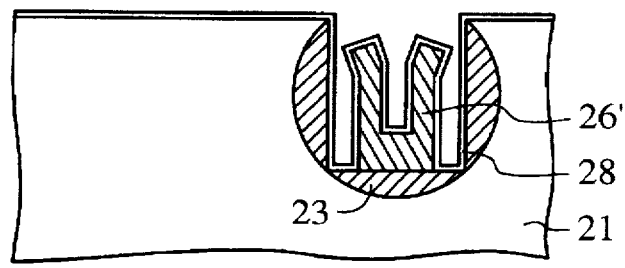

As illustrated in FIG. 2C, first conductive layer 26, which is to serve as the plate electrode, is etched as much as the height of mask 27, thereby forming plate electrode 26. Under this condition, the etched depth is such that the upper face of side wall 25 may be exposed, while the shape of plate electrode 26' may be like a cylinder, a pole or a cup.

First and second insulating layers 24 and 25 are removed by carrying out an isotropic wet etching such as using fluoric acid (HF) having a concentration of $HF:H_2O=1:99$, thereby exposing plate electrode 26'. Under this condition, exposed plate electrode 26' has a cylindrical shape, and, therefore, the surface area is increased, with the result that the capacitance is increased. Dielectric layer 28 composed of N—O (Nitride-Oxide), O—N—O or the like is deposited on exposed plate electrode 26'.

Figure 2D:
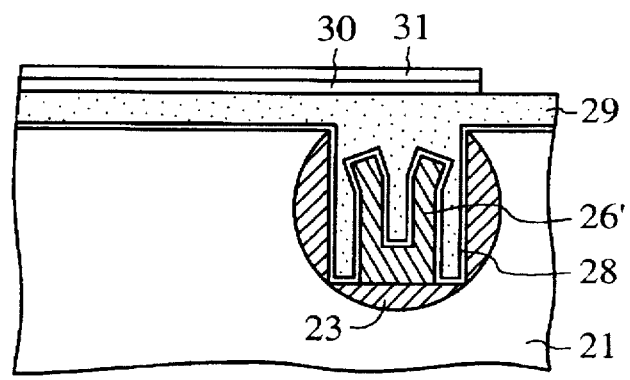

As illustrated in FIG. 2D, second conductive layer 29 composed of a high melting point conductor is deposited for forming a capacitor node electrode. Thereupon, third insulating layer 30 in the form of a thin oxide layer is grown to a thickness of about 100–300 Å. Fourth insulating layer 31 in the form of a nitride layer is deposited to a thickness of about 1,000–2,000 Å under an atmosphere of $NH_3+SiH_4$ at a temperature of about 700°–800° C. by applying a low pressure chemical vapor deposition method (LPCVD). The patterns of fourth and third insulating layers 31 and 30 which correspond to the element isolating portion are formed.

Figure 2E:
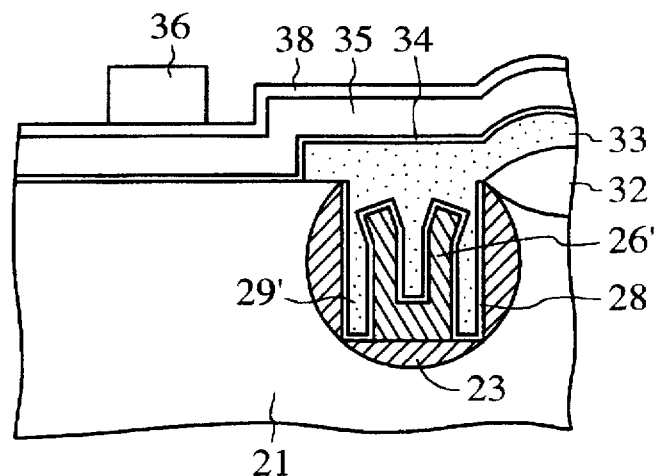

As illustrated in FIG. 2E, a LOCOS isolation oxidation is carried out by heating under a gas atmosphere of $H_2+O_2$, $H_2O$, or $O_2$ at a temperature of about 850°–1100° C., thereby forming field oxide layer 32.

After formation of field oxide layer 32, fourth and third insulating layers 31 and 30 are successively removed. Second conductive layer 29 and dielectric layer 28, which are formed on semiconductor substrate 21, are etched back to form a part of node electrode 29' within the trench region, and to expose the surface of substrate 21 except the trench region. Third conductive layer 33, which is for connecting the node electrode, is deposited using polysilicon, which is a high melting point conductive material. A defining operation is conducted in such a manner that only the portion to connect the node electrode to a source region (to be formed later) may remain, and a limited etching is carried out, thereby forming node electrode 33.

Thereafter, MOSFET formation processes may be carried out for making pass transistors for DRAM cells according to a conventional technique. That is, thin gate oxide layer 34 may be grown to a thickness of about 100–250 Å, and thereupon gate polysilicon layer 35 may be deposited to a thickness of about 3,000–5,000 Å under an atmosphere of $SiH_4+PH_3$ at a temperature of about 520°–620° C. Gate cap insulating layer 38 is deposited thereupon, and photo resist mask 36 is formed, thereby defining a gate region.

Figure 2F:
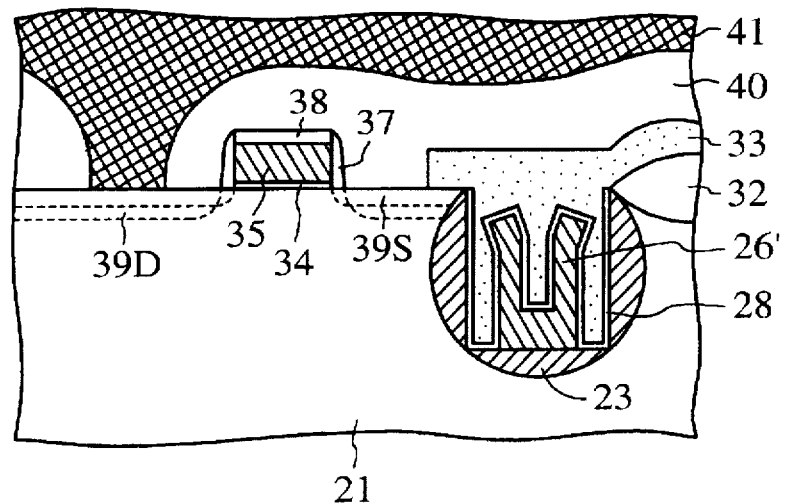

As illustrated in FIG. 2F, insulating layer 38, gate polysilicon layer 35 and gate oxide layer 34 are successively etched to form a gate electrode. In next step, a gate side wall may be formed on the sides of the gate electrode, and source and drain regions 39S and 39D are formed, and thus the source electrode 39S is connected to node electrode 33. An insulating layer is deposited to form surface protecting layer 40, and a limited etching is carried out to open a contact hole on the bit line portion of protecting layer 40. Then, a conductive layer is deposited to form bit line 41, and bit line 41 is patterned for connecting drain region 39D of the transistor.

According to the present invention as described above, the plate electrode, which is shaped like a cylindrical pole, is formed within the trench by using polysilicon, so that the surface of the pole and the side wall of the trench can be utilized as the capacitor area. Consequently, the capacitance of the capacitor is increased, and the cell density is improved. Particularly, the present invention can be suitably applied to high density semiconductor memories such as 16 M and 64 M DRAMS and the like.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for formation of a semiconductor memory cell, comprising the steps of:
    (a) forming a trench in a portion of a semiconductor substrate of a first conductivity type, forming a first material layer containing impurities of the first conductivity type in the trench, carrying out a heat treatment, wherein the impurities in the first material layer diffuse to form an impurity diffusion region in the substrate surrounding the trench, and removing the first material layer;
    (b) forming first and second insulating layers on the semiconductor substrate, and anisotropically etching the first and second insulating layers to form side walls within the trench, wherein an exposed portion of the substrate is formed at a bottom portion of the trench;
    (c) depositing a first conductive layer within the trench, wherein the first conductive layer contacts the exposed portion of the substrate, and etching back the first conductive layer to form a first conductive layer pole within the trench, and removing the side walls of the first and second insulating layers to form a plate electrode in the trench;
    (d) forming a capacitor dielectric layer on the plate electrode, and forming a capacitor node electrode by depositing a second conductive layer of a second conductivity type on the substrate and the capacitor dielectric layer, and patterning the second conductive layer; and
    (e) forming a pass transistor having a gate electrode and source and drain regions in the substrate adjacent to the trench, the source or drain region of the pass transistor being connected to the node electrode, wherein the pass transistor couples the node electrode to a bit line.

2. The process of claim 1, wherein the step for forming a pass transistor in step (e) comprises the steps of:
    depositing third and fourth insulating layers upon the capacitor node electrode, etching the third and fourth insulating layers to define an isolating region and an active region, forming a field oxide layer in the isolating region by applying an oxidizing method, and removing the third and fourth insulating layers;
    etching back the second conductive layer, wherein the substrate in the active region is exposed, depositing a third conductive layer on the substrate and the second conductive layer, and etching the third conductive layer, wherein the third conductive layer extends over an exposed portion of the active region and is connected to the node electrode; and
    forming the gate electrode, source region and drain region, wherein the source region is connected to the node electrode through the third conductive layer.

3. The process of claim 2, wherein the third conductive layer comprises a high melting point conductive material.

4. The process of claim 3, wherein the high melting point conductive material comprises polysilicon deposited to a thickness of about 3,000–5,000 Å under an atmosphere of $SiH_4+PH_3$ at a temperature of about 520°–620° C.

5. The process as claimed in claim 2 wherein the third insulating layer is formed by growing a thermally oxidized layer to a thickness of about 100–300 Å, and the fifth insulating layer is deposited to a thickness of about 1,000–2,000 Å by applying a low pressure chemical vapor deposition method under a chemically reactive atmosphere of $NH_3+SiH_4$ at a temperature of about 700°–800° C.

6. The process of claim 2, wherein the field oxide layer is formed to a thickness of about 4,000–5,000 Å by applying an isolation oxidation method under an atmosphere of $H_2+O_2$, $H_2O$ or $O_2$ gas at a temperature of about 850°–1100° C.

7. The process of claim 1, wherein, at step (c), after the first conductive layer is deposited, a second material layer comprising a material having a large etch selectivity as compared with the first conductive layer is deposited, and an etch-back is carried out to form a mask of the second material layer in an interior portion of the first conductive layer, wherein the first conductive layer is etched back so as to form a plate electrode shaped like a cup within the trench.

8. The process of claim 7, wherein, the second material layer is formed with a photo resist or a silicon oxide.

9. The process of claim 1, wherein, at step (a), the first material layer containing impurities comprises BSG and is deposited under an atmosphere of $SiH_4+O_2+BH_3$ at a temperature of about 350°–700° C.

10. The process of claim 9, wherein, at step (a), the impurity diffusion region is formed by carrying out a heat treatment under an $N_2$ gas atmosphere at a temperature of about 600°–900° C.

11. The process of claim 1, wherein, at step (b), the first insulating layer comprises a thermally oxidized layer.

12. The process of claim 11, wherein the thermally oxidized layer is grown to a thickness of about 50–200 Å by carrying out a thermal oxidation under an atmosphere of $H_2+O_2$, $H_2O$ or $O_2$ at a temperature of about 850°–1,000° C. for about 30 minutes to 2 hours.

13. The process of claim 1, wherein, at step (b), the second insulating layer comprises a CVD oxidation layer.

14. The process of claim 13, wherein the CVD oxidation layer is deposited to a thickness of about 1,000–2,000 Å under an atmosphere of $SiH_4+O_2$ at a temperature of about 350°–700° C.

15. The process of claim 1, wherein, at step (c), the plate electrode is formed using a high melting point conductive material.

16. The process of claim 15, wherein the high melting point conductive material comprises polysilicon deposited to a thickness of about 1,000–2,000 Å under an atmosphere of $SiH_4+PH_3$ at a temperature of about 520°–620° C.

17. The process of claim 1, wherein, at step (d) the second conductive layer comprises a high melting point conductive material.

18. The process of claim 17, wherein the high melting point conductive material comprises polysilicon.

19. The process of claim 1, wherein the trench is formed by etching the semiconductor substrate down to a depth of about 0.5–5 μm.

20. A process for forming a semiconductor memory cell, comprising the steps of:

forming a trench in a portion of a semiconductor substrate of a first conductivity type;

forming an impurity region of the first conductivity type in the substrate adjacent to the trench;

forming a side wall spacer on a side portion of the trench;

depositing a first conductive layer on the side wall spacer and a bottom portion of the trench, wherein the first conductive layer is connected to the substrate at the bottom portion of the trench and serves as a plate electrode;

forming an insulating layer having a large etch selectively as compared with the first conductive layer on the first conductive layer, etching the insulating layer to form a mask on the first conductive layer, and etching the first conductive layer using the mask;

removing the side wall spacer;

forming a dielectric layer on the first conductive layer and the impurity region in the substrate;

forming a second conductive layer of a second conductivity type on the dielectric layer to serve as a storage electrode; and forming a pass transistor having a gate and source and drain regions in the substrate adjacent to the trench;

wherein the source or drain region of the pass transistor is connected to the storage electrode.

* * * * *